United States Patent [19]
Kai et al.

[11] Patent Number: 5,949,106
[45] Date of Patent: Sep. 7, 1999

[54] FET INPUT/OUTPUT PAD LAYOUT

[75] Inventors: Seiji Kai; Yoshihiro Yamamoto; Masaaki Itoh; Koutarou Tanaka, all of Tokyo, Japan

[73] Assignee: Oki Electric Industry Co., Ltd., Tokyo, Japan

[21] Appl. No.: 08/887,905

[22] Filed: Jul. 8, 1997

[30] Foreign Application Priority Data

Jul. 8, 1996 [JP] Japan ................................. 8-177863

[51] Int. Cl.$^6$ ............................................. H01L 29/78
[52] U.S. Cl. ............................................. 257/341; 257/786
[58] Field of Search ..................... 257/786, 341, 257/743

[56] References Cited

U.S. PATENT DOCUMENTS

| | | | |
|---|---|---|---|
| 4,753,820 | 6/1988 | Cusack | 257/786 |
| 4,875,138 | 10/1989 | Cusack | 257/786 |
| 4,974,053 | 11/1990 | Kinoshita et al. | 257/786 |
| 5,757,082 | 5/1998 | Shibata | 257/786 |
| 5,796,171 | 8/1998 | Koc et al. | 257/786 |

FOREIGN PATENT DOCUMENTS

| | | |
|---|---|---|
| 0714128 A2 | 5/1996 | European Pat. Off. . |
| 0766309 A2 | 4/1997 | European Pat. Off. . |
| 60200547 | 10/1985 | Japan . |
| 03201447 | 9/1991 | Japan . |
| 04011743 | 1/1992 | Japan . |
| 05121458 | 5/1993 | Japan . |
| 05183161 | 7/1993 | Japan . |
| 06069249 | 3/1994 | Japan . |
| 08111618 | 4/1996 | Japan . |

*Primary Examiner*—David B. Hardy
*Attorney, Agent, or Firm*—Rabin & Champagne, P.C.

[57] ABSTRACT

A power FET for which it is difficult to generate oscillations dependent on the interval between adjacent pads. The power FET has a plurality of pads for first terminals, which are disposed on one side of a chip at unequal intervals, and a plurality of pads for second terminals, which are placed on the other side of the chip. Alternatively, or in addition, the plurality of pads for the second terminals may also be disposed at unequal intervals.

18 Claims, 3 Drawing Sheets

FET INPUT/OUTPUT PAD LAYOUT

BACKGROUND OF THE INVENTION

1. Field of the Invention

This invention relates to a semiconductor device, and particularly to a semiconductor device suitable for use in a power FET that handles a high-frequency signal.

2. Description of the Related Art

As a technique related to this type of FET, one described in the following reference, for example, has heretofore been known.

Reference: John L. B. Valker, "High Power GaAs FET Amplifier", ARTECH HOUSE, INC., P. 123, 1993.

FIG. 3 is a pattern plan view showing an example of a chip cl having one configuration of a conventional power FET described in the above-described reference.

This type of FET comprises a region F1 activated as the FET, a row D11–D16 of pads used to draw drain terminals, and a row G11–G14, S11–S15 of pads used to draw gate and source terminals.

The pads for the drains are arranged at uniform intervals as shown in the drawing. Further, the pads for the gates and sources are also alternately placed at uniform intervals.

The conventional power FET has a drawback in that it oscillates at a frequency dependent on the size of the interval between the pads upon its operation.

This drawback will be explained below. In the conventional power FET, the drain pads used as the same terminals exist in plural form as shown in FIG. 3.

This is because there is a restriction on the amount of power capable of being drawn at any one pad. In order to set power quantities capable of being drawn at the respective pads as uniformly as possible or for convenience of the formation of patterns, the intervals between the adjacent pads have heretofore been rendered uniform as shown in FIG. 3 in consideration of workability or the like at wire-bonding. The same signals, i.e., signals identical in amplitude and phase to each other, are supplied to the plurality of pads for the drains. However, since the intervals between the pads are uniform, standing waves in which the positions of the pads are set as nodes, can exist.

Thus, oscillations are likely to take place at a frequency at which the interval between the pads is set to one or half wavelength. The oscillations are likely to occur even in the case of the pad row of the sources and gates.

As has been described above, the conventional power FET has a drawback in that the oscillations take place at the frequency at which the interval between the pads is set to one or half wavelength.

SUMMARY OF THE INVENTION

With the forgoing in view, it is therefore an object of the present invention to provide a power FET for which it is difficult to generate oscillations at a frequency dependent on the interval between adjacent pads.

According to one aspect of the present invention, for achieving the above object, there is provided a semiconductor device including:

a power FET which comprises a plurality of pads used for drawing gate, source and drain terminals and wherein a row of the drain pads is disposed on one side of a chip and a row of the gate, and drain pads is disposed on the side opposite to the one side thereof; and wherein the intervals between the pads in the pad row of the drains employed in the power FET are set to unequal intervals.

According to another aspect of the present invention, for achieving the above object, there is provided a semiconductor device including:

a power FET which comprises a plurality of pads used for drawing gate, source and drain terminals and wherein a row of the drain pads is disposed on one side of a chip and a row of the gate and drain pads is disposed on the side opposite to the one side thereof; and wherein the intervals between the pads in the pad row of the drains and gates employed in the power FET are set to unequal intervals.

Typical aspects and embodiments of the invention are disclosed. However, the various embodiments of the present inventions and specific configurations of this invention will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features, and advantages thereof will be better understood from the following description taken in connection with the accompanying drawings in which:

DETAILED DESCRIPTION OF THE PREFERRED EMBODIMENTS

Figure 1:
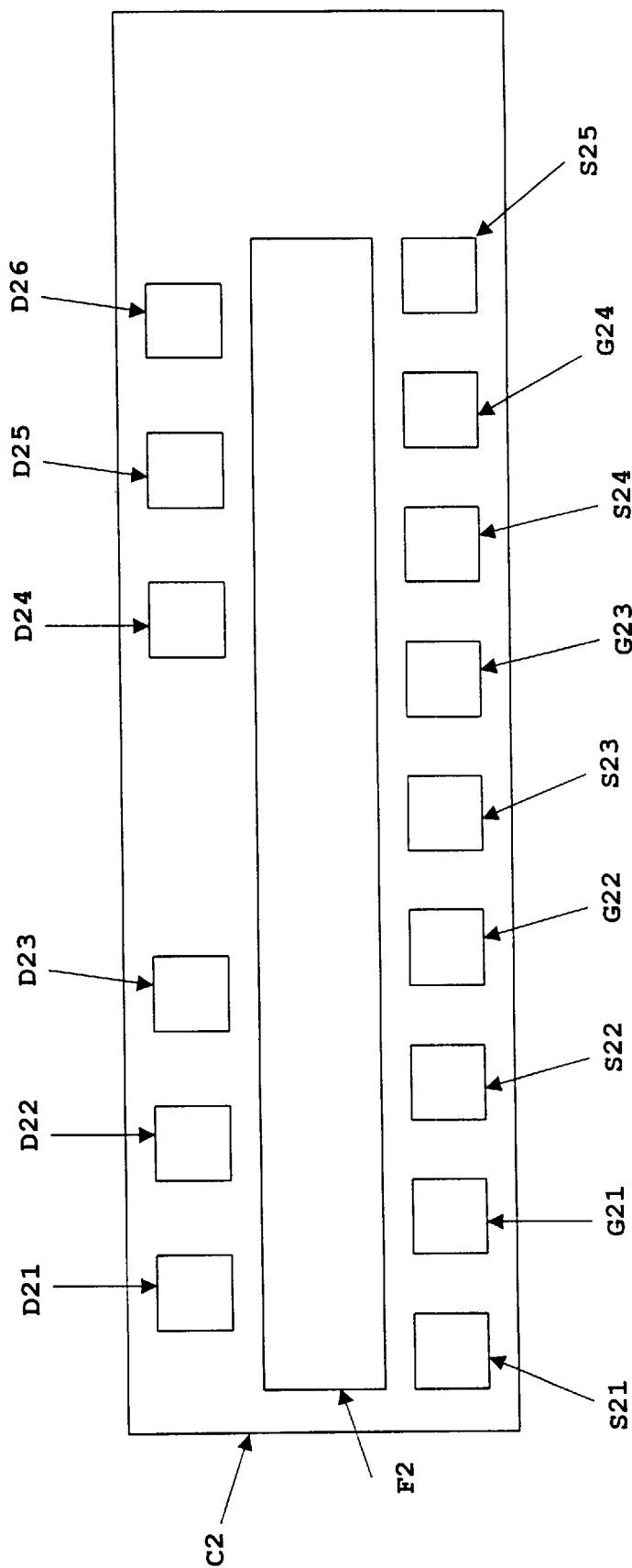
FIG. 1 is a pattern plan view of a power FET employed in a semiconductor device showing a first embodiment of the present invention.
Figure 2:
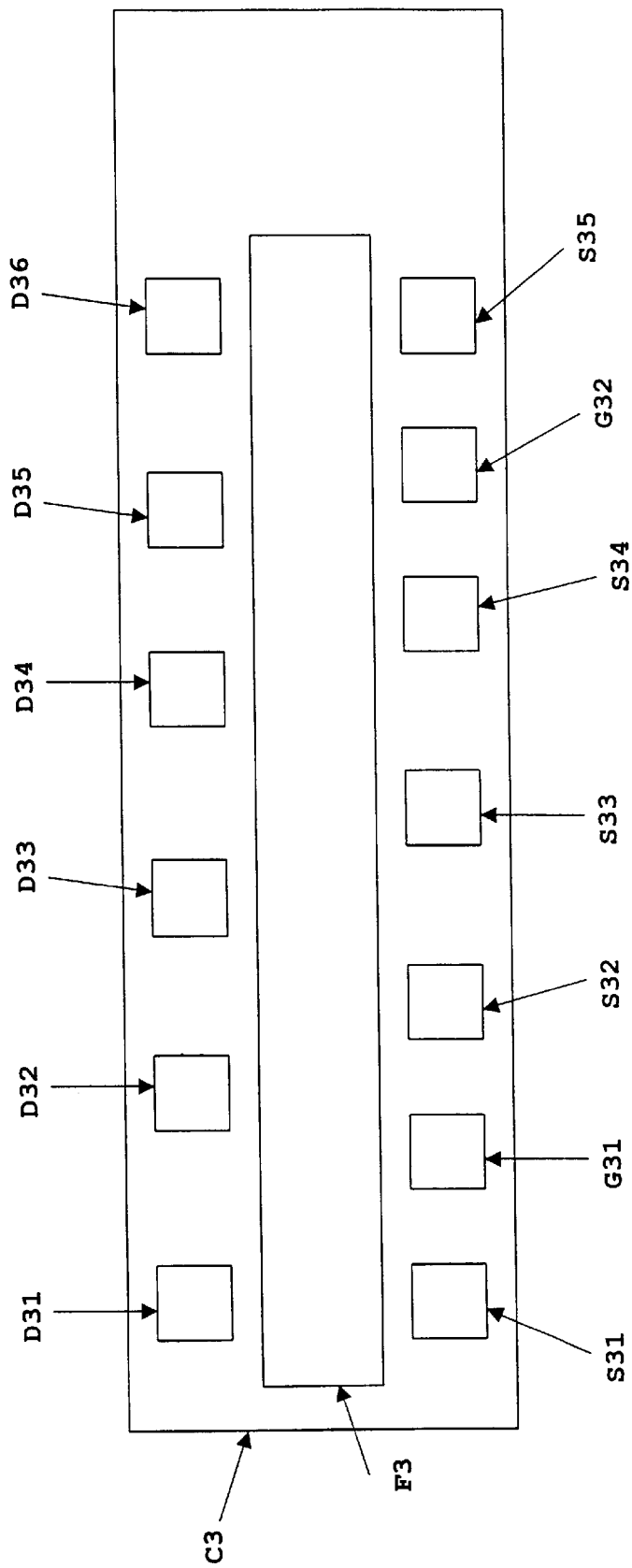
FIG. 2 is a pattern plan view of a power FET employed in a semiconductor device illustrating a second embodiment of the present invention.

Semiconductor devices of the present invention will hereinafter be described as preferred embodiments with reference to the accompanying drawings. FIGS. 1 and 2 simply schematically show the relationship between shapes, dimensions, and positions of the present invention.

[First embodiment]

FIG. 1 a plan view of a chip C2 for a power FET showing a first embodiment of a semiconductor device according to the present invention.

Figure 3:
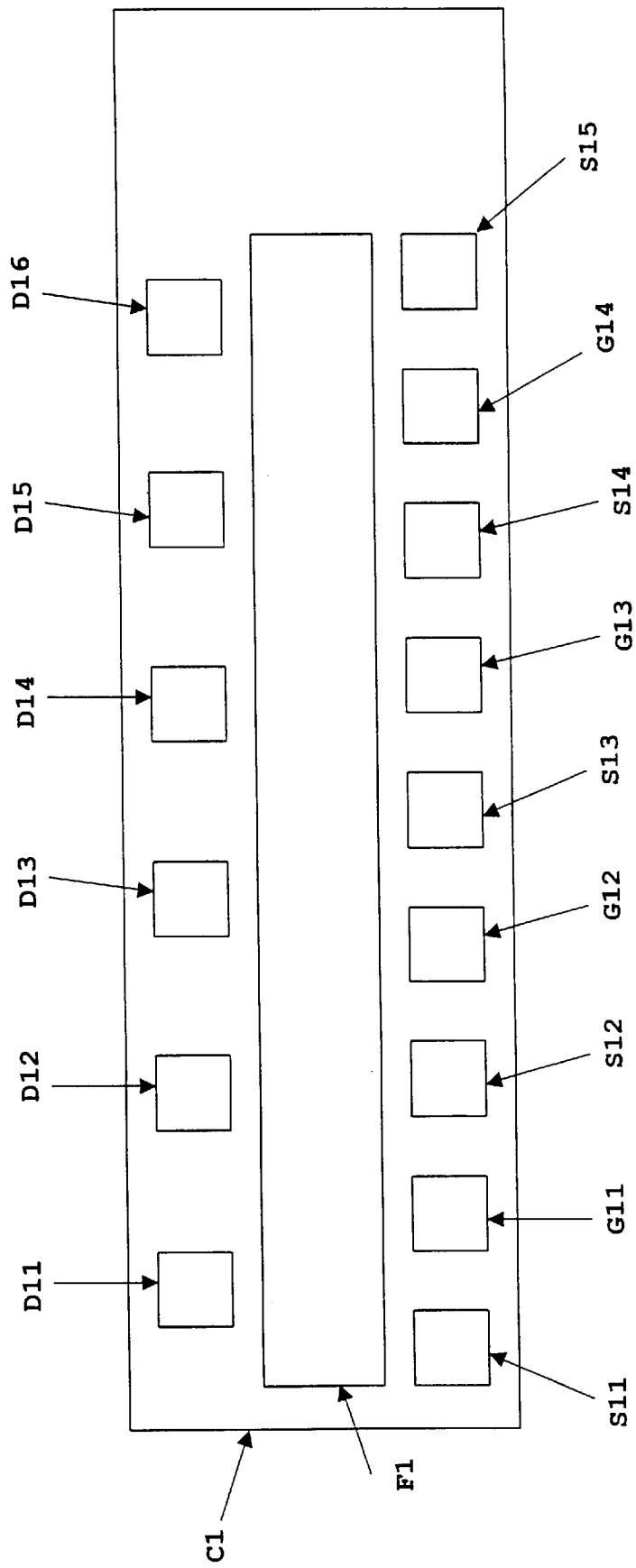
FIG. 3 is a pattern plan view of a power FET employed in a conventional semiconductor device.

As shown in FIG. 1, a pad row of drains has six pads D21–D26 in the same manner as that employed in the prior art shown in FIG. 3. The amount of power per pad is identical to that employed in the prior art shown in FIG. 3. However, the pads are arranged side by side at equal intervals in the conventional power FET, whereas in the present invention, the interval between pads D23 and D24 is wider than that between adjacent other pads and hence the pads are arranged at unequal intervals.

When a standing wave attempts to occur or develop at a wavelength corresponding to the interval between pads D21 and D22 in the case of the pad layout or arrangement shown in FIG. 1, a wavelength corresponding to the interval between the pads D23 and D24 differs from that wavelength. Thus, no standing wave is produced. When the standing wave attempts to occur at a wavelength corresponding to the interval between the pads D23 and D24, wavelengths corresponding to the interval between the pads D22 and D23 and the interval between the pads D24 and D25 differ from the wavelength corresponding to the interval between the pads D23 and D24. Thus, the standing wave eventually leads is not generated.

According to the first embodiment as described above, since the intervals between the adjacent pads of the pad row, which are used for the drawing drain terminals, are rendered nonuniform, the standing wave attributed to the pad-to-pad interval is not produced. Thus, a power FET can be provided for which it is difficult to oscillate at a frequency dependent on the pad-to-pad interval.

[Second embodiment]

A second embodiment of a semiconductor device according to the present invention will next be described with reference to a plan view of a chip C3 for a power FET shown in FIG. 2.

The second embodiment shows a case in which the intervals between pads of a pad row G31, G32, S31–S35 composed of gates and sources are held uneven. In a power FET, a large current or high power is generally supplied to pads for drains and sources, whereas a large current or power usually is not supplied to pads for gates. Thus, in the second embodiment, the number of the pads for the sources is set to the same as that employed in the conventional power FET and the number of the pads for the gates is reduced.

When a standing wave attempts to develop at a wavelength corresponding to the interval between pads G31 and S32 in a pad layout shown in FIG. 2, a wavelength corresponding to the interval between pads S32 and S33 differs from that wavelength. Therefore, the standing wave is not produced. On the other hand, when a standing wave attempts to occur at a wavelength corresponding to the interval between the pads S32 and S33, the wavelength corresponding to the interval between the pads G31 and S32 and a wavelength corresponding to the interval between the pads S33 and S34 differ from the wavelength corresponding to the interval between the pads S32 and S33. Thus, the standing wave is not generated.

Further, the gates are used as inputs of the present power FET. Thus, when oscillations are generated on the gate side, the oscillations are amplified by the FET so as to appear on the drain side when the frequency of the oscillations falls within an operation frequency range of the FET. Accordingly, the prevention of the oscillations on the gate side or input side is of importance.

According to the second embodiment of the present invention as described above, since the intervals between the pads of the pad row, which are used for the drawing of gate and source terminals, are rendered uneven, the standing wave attributable to the pad-to-pad interval is not produced. Thus, a power FET can be provided for which it is difficult to oscillate at a frequency dependent on the interval between the pads.

According to the semiconductor devices of the present invention, as has been described above in detail, the first embodiment can bring about an advantageous effect in that the oscillations attributed to the interval between the adjacent pads on the drain side of the power FET can be prevented.

Further, the second embodiment of the present invention can bring about an advantageous effect in that the oscillations attributed to the interval between the adjacent pads on the gate and source sides of the power FET can be prevented.

Moreover, the first and second embodiments of the present invention can be simultaneously carried out. In this case, the oscillations caused by the interval between the adjacent pads can be prevented on both sides, that is, the drain side and the gate and source side.

In the illustrated embodiments, the row of the pads for the source terminals and the row of the pads for the gate terminals have been placed on the same side. However, the pads for the gate terminals may be placed on the other side.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A power FET formed on a semiconductor chip, comprising:

a plurality of pads for receiving input signals to the power FET and for providing output signals from the power FET, wherein all pads for receiving said input signals and all pads for providing said output signals are disposed along only two sides of the semiconductor chip, and wherein said plurality of pads includes a first plurality of pads for first terminals of the power FET for carrying substantially identical first signals, which are disposed only along one side of said two sides of the semiconductor chip at unequal intervals;

a second plurality of p2ads for second terminals of the power FET for carrying substantially identical second signals, which are disposed only along the other side of said two sides of the semiconductor chip; and a third plurality of pads for third terminals of the power FET for carrying substantially identical third signals, which are disposed only along the other side of said two sides of the semiconductor chip;

wherein said first terminals are FET drain terminals connected to a drain region of the power FET.

2. A power FET according to claim 1, wherein said first plurality of pads for the first terminals and said second and third pluralities of pads for the second and third terminals are respectively disposed on opposite sides of the semiconductor chip.

3. A power FET according to claim 1, wherein a number of said second pads is greater than a number of said third pads.

4. A power FET according to claim 1, wherein said second pads and said third pads are interspersed along said other side.

5. A power FET according to claim 1, wherein the substantially identical second signals are the same as the substantially identical third signals.

6. A power FET formed on a semiconductor chip, comprising:

a plurality of pads for receiving input signals to the power FET and for providing output signals from the power FET, wherein all pads for receiving said input signals and all pads for providing said output signals are disposed along only two sides of the semiconductor chip, and wherein said plurality of pads includes a first plurality of pads for first terminals of the power FET for carrying substantially identical first signals, which are disposed only along one side of said two sides of the semiconductor chip;

a second plurality of pads for second terminals of the power FET for carrying substantially identical second signals, which are disposed only along the other side of said two sides of the semiconductor chip at unequal intervals; and a third plurality of pads for third terminals of the power FET for carrying substantially identical third signals, which are disposed only along the other side of said two sides of the semiconductor chip at unequal intervals;

wherein said second and third terminals are FET source terminals connected to a source region of the power FET and FET gate terminals connected to a gate region of the power FET, respectively.

7. A power FET according to claim 6, wherein said first plurality of pads for the first terminals and said second and third pluralities of pads for the second and third terminals are respectively disposed on opposite sides of the semiconductor chip.

8. A power FET according to claim 6, wherein a number of said second pads is greater than a number of said third pads.

9. A power FET according to claim 6, wherein said second pads and said third pads are interspersed along said other side.

10. A power FET according to claim 6, wherein the substantially identical second signals are the same as the substantially identical third signals.

11. A power FET formed on a semiconductor chip, comprising:
a plurality of pads for receiving input signals to the power FET and for providing output signals from the power FET, wherein all pads for receiving said input signals and all pads for providing said output signals are disposed along only two sides of the semiconductor chip, and wherein said plurality of pads includes
a first plurality of pads for first terminals of the power FET for carrying substantially identical first signals, which are disposed only along one side of said two sides of the semiconductor chip at unequal intervals;
a second plurality of pads for second terminals of the power FET for carrying substantially identical second signals, which are disposed only along the other side of said two sides of the semiconductor chip; and
a third plurality of pads for third terminals of the power FET for carrying substantially identical third signals, which are disposed only along the other side of said two sides of the semiconductor chip;
wherein said second terminals are source terminals connected to a source region of the power FET.

12. A power FET formed on a semiconductor chip, comprising:
a plurality of pads for receiving input signals to the power FET and for providing output signals from the power FET, wherein all pads for receiving said input signals and all pads for providing said output signals are disposed along only two sides of the semiconductor chip, and wherein said plurality of pads includes
a first plurality of pads for first terminals of the power FET for carrying substantially identical first signals, which are disposed only along one side of said two sides of the semiconductor chip at unequal intervals;
a second plurality of pads for second terminals of the power FET for carrying substantially identical second signals, which are disposed only along the other side of said two sides of the semiconductor chip; and
a third plurality of pads for third terminals of the power FET for carrying substantially identical third signals, which are disposed only along the other side of said two sides of the semiconductor chip;
wherein said third terminals are gate terminals connected to a gate region of the power FET.

13. A power FET formed on a semiconductor chip, comprising:
a plurality of pads for receiving input signals to the power FET and for providing output signals from the power FET, wherein all pads for receiving said input signals and all pads for providing said output signals are disposed along only two sides of the semiconductor chip, and wherein said plurality of pads includes
a first plurality of pads for first terminals of the power FET for carrying substantially identical first signals, which are disposed along only one side of said two sides of the semiconductor chip at unequal intervals;
a second plurality of pads for second terminals of the power FET for carrying substantially identical second signals, which are disposed only along the other side of said two sides of the semiconductor chip at unequal intervals; and
a third plurality of pads for third terminals of the power FET for carrying substantially identical third signals, which are disposed only along the other side of said two sides of the semiconductor chip at unequal intervals;
wherein said first terminals are drain terminals connected to a drain region of the power FET.

14. A power FET according to claim 13, wherein said first plurality of pads for the first terminals and said second and third pluralities of pads for the second and third terminals are respectively disposed on opposite sides of the semiconductor chip.

15. A power FET according to claim 13 wherein said second pads and said third pads are interspersed along said other side.

16. A power FET according to claim 13, wherein the substantially identical second signals are the same as the substantially identical third signals.

17. A power FET formed on a semiconductor chip, comprising:
a plurality of pads for receiving input signals to the power FET and for providing output signals from the power FET, wherein all pads for receiving said input signals and all pads for providing said output signals are disposed along only two sides of the semiconductor chip, and wherein said plurality of pads includes
a first plurality of pads for first terminals of the power FET for carrying substantially identical first signals, which are disposed along only one side of said two sides of the semiconductor chip at unequal intervals;
a second plurality of pads for second terminals of the power FET for carrying substantially identical second signals, which are disposed only along the other side of said two sides of the semiconductor chip at unequal intervals; and
a third plurality of pads for third terminals of the power FET for carrying substantially identical third signals which are disposed only along the other side of said two sides of the semiconductor chip at unequal intervals;
wherein said second terminals are source terminals connected to a source region of the power FET, and said third terminals are gate terminals connected to a gate region of the power FET.

18. A power FET formed on a semiconductor chip, comprising:
a plurality of pads for receiving input signals to the power FET and for providing output signals from the power FET, wherein all pads for receiving said input signals and all pads for providing said output signals are disposed along only two sides of the semiconductor chip, and wherein said plurality of pads includes a first plurality of pads for first terminals of the power FET for carrying substantially identical first signals, which are disposed only along one side of said two sides of the semiconductor chip;

a second plurality of pads for second terminals of the power FET for carrying substantially identical second signals, which are disposed only along the other side of said two sides of the semiconductor chip at unequal intervals; and a third plurality of pads for third terminals of the power FET for carrying substantially identical third signals, which are disposed only along the other side of said two sides of the semiconductor chip at unequal intervals;

wherein said first terminals are drain terminals connected to a drain region of the power FET.

* * * * *